(12) United States Patent
Park et al.

(10) Patent No.: US 6,730,975 B2
(45) Date of Patent: May 4, 2004

(54) DRAM DEVICE (75) Inventors: Byung-Jun Park, Kyunggi-do (KR); Kyu-Hyun Lee, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/207,169

(22) Filed: Jul. 30, 2002

(65) Prior Publication Data

US 2002/0187598 A1 Dec. 12, 2002

Related U.S. Application Data (62) Division of application No. 09/931,861, filed on Aug. 20, 2001, now Pat. No. 6,451,651.

(30) Foreign Application Priority Data

Feb. 7, 2001 (KR) .......................................... 2001-5979

(51) Int. Cl.$^7$ ............................................. H01L 31/119
(52) U.S. Cl. ...................... 257/396; 257/301; 257/302; 438/257; 438/637; 438/672
(58) Field of Search ................. 438/637–639, 438/253, 700, 672–675; 257/396, 622, 306, 295, 296, 301

(56) References Cited

U.S. PATENT DOCUMENTS

| 5,252,517 | A | * | 10/1993 | Blalock et al. | ............. 438/396 |
| 6,090,698 | A | * | 7/2000 | Lee | ............. 438/619 |
| 6,194,309 | B1 | * | 2/2001 | Jin | ............. 438/639 |
| 6,368,906 | B1 | | 4/2002 | Shin et al. | |
| 6,376,874 | B1 | | 4/2002 | Kim | |

* cited by examiner

Primary Examiner—Dung A. Le
(74) Attorney, Agent, or Firm—Lee & Sterba, P.C.

(57) ABSTRACT

A DRAM device in which a portion of bit lines has enlarged width portions at a portion of a peripheral/core area to be connected with upper layered circuit wiring through metal contacts, includes spacers formed of a layer of material having an etch selectivity with respect to a bit line interlayer insulating layer deposited after said bit lines are formed, and disposed on sides of an upper surface of each said enlarged width portion to protect sides of said enlarged width portions; an interlayer insulating layer and at least a portion of an etch stop layer disposed between said bit lines and transistors of a substrate; and metal contact pads formed along with bit line contact plugs to pass through said interlayer insulating layer and said etch stop layer.

4 Claims, 10 Drawing Sheets

Fig. 1

(Prior Art)

Fig. 2

(Prior Art)

DRAM DEVICE

This application is a DIVISION of application Ser. No. 09/931,861, filed Aug. 20, 2001 now U.S. Pat. No. 6,451,651.

BACKGROUND OF THE INVENTION

1. Field of the Invention

The present invention relates to a dynamic random access memory (DRAM) device and method of manufacturing the same. More particularly, the present invention relates to a dynamic random access memory (DRAM) device and method of manufacturing the same, which can prevent problems associated with an increase in depth of metal contacts in forming thereof.

2. Description of the Related Art

As the elements incorporated into a semiconductor device are integrated to a higher degree, various attempts to form a plurality of wires or the elements in a small or narrow area in a substrate have been made. It is typical of these attempts to have the semiconductor device to become more multi-layered. Particularly, a method of forming capacitors on bit line (COB) to increase surface area thereof is widely used. In this method, metal oxide semiconductor (MOS) transistors are formed on the substrate and the capacitors connected with drains of the MOS transistors are disposed on the bit lines which supply data signals to sources of the MOS transistors. Thus, required plane area in the method can be reduced as compared with a structure having capacitors formed on the substrate.

Also, to form storage electrodes of the capacitors having a large surface area in a small substrate area, hemispherical grains (HSG) can be formed on the surface of the silicon storage electrodes. However, in this case, as the semiconductor device is highly integrated, short circuit between the adjacent storage electrodes may occur. Accordingly, in a highly integrated DRAM device, a method of adopting cylindrical shaped storage electrodes and increasing height thereof is frequently used. To increase performance of the DRAM device within the limit of a certain area, an increase in the height of the cylindrical shaped storage electrodes to several $\mu$m is required. In addition, the depth of metal contacts which connect circuits within the substrate at a peripheral/core area of the DRAM device needs to be increased.

If the depth of the metal contacts is increased, according to need, silicon nitride layers have to be etched to form the metal contacts. Since it is difficult to form metal contacts having different depths in particular places, the metal contacts are prone to form short circuits with adjacent or surrounding elements. Also, since it is difficult to control the depth of the contacts, a problem may occur that the contacts are not extended enough to be connected to the required places.

Figure 1:
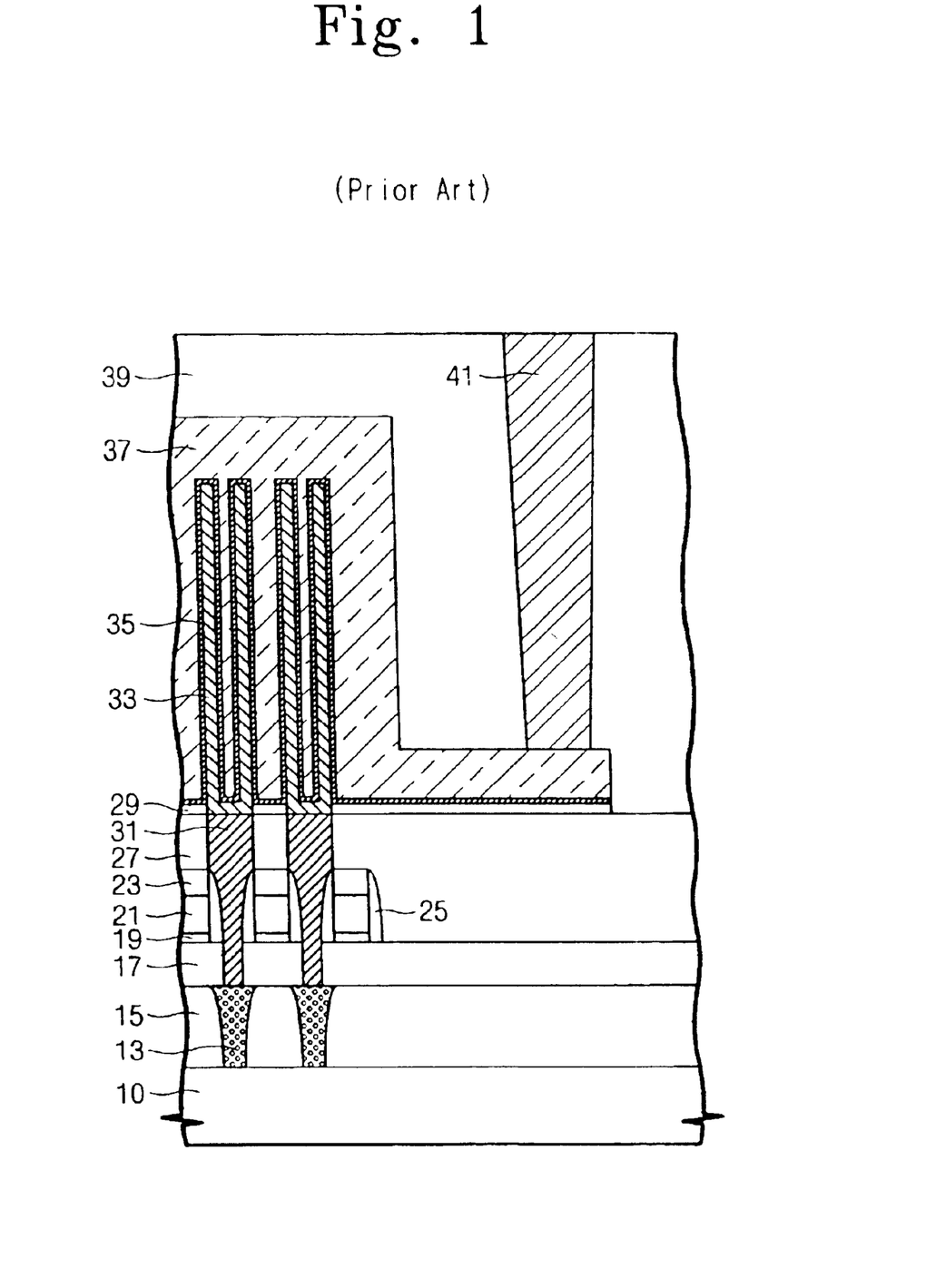
FIG. 1 illustrates a cross-sectional view showing a portion of a cell area of a conventional DRAM device according to the prior art.
Figure 2:
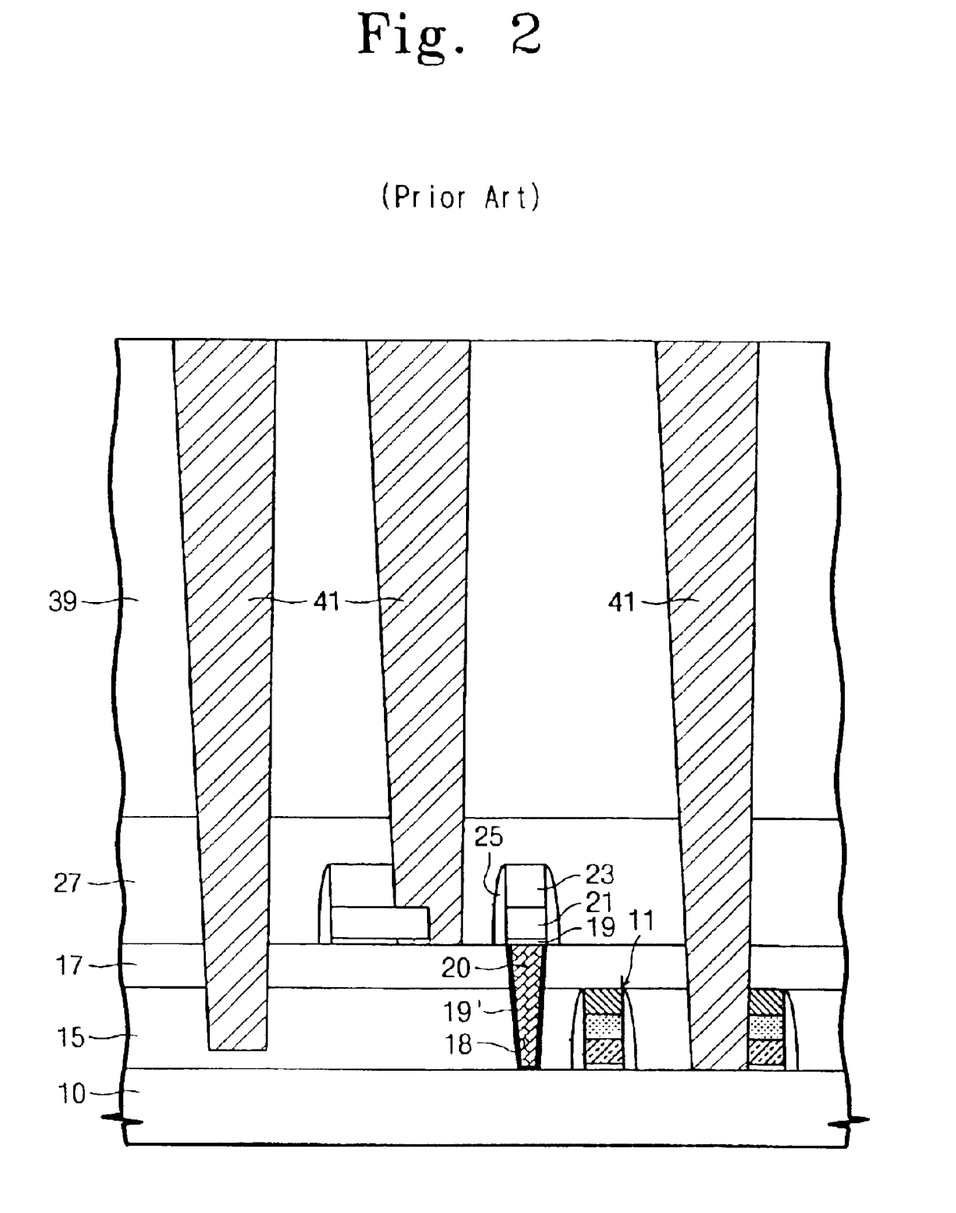
FIG. 2 illustrates a cross-sectional view showing a portion of a peripheral/core area cell area of the conventional DRAM device to illustrate problems in forming of metal contacts according to the prior art.

FIG. 1 and FIG. 2 illustrate cross-sectional views showing portions of a cell and a peripheral/core areas of a conventional DRAM device, respectively. FIG. 1 illustrates the portion of the cell area taken parallel to gate lines and FIG. 2 illustrates problems that can occur in the peripheral/core area of the conventional DRAM device in forming of metal contacts.

Referring now to FIG. 1 and FIG. 2, an isolation layer (not shown) is formed on a semiconductor substrate 10 to define an active region. Then, a gate insulating layer is formed on the whole surface of the substrate 10 including the isolation layer by using thermal oxidation. On the gate insulating layer, a gate layer and a capping-insulating layer are formed in order. The gate layer is formed of a polysilicon layer and a metal silicide layer, whereas the capping-insulating layer is formed of a silicon nitride layer. Then, the capping-insulating layer and the conductive layer are sequentially patterned to form a gate pattern 11 including gate electrodes and wires. Thereafter, a low concentration ion implantation is carried out on the substrate 10. After spacers are formed on side walls of the gate pattern 11, a high concentration ion implantation is carried out on the substrate 10. As a result, transistors are formed to have channels and source/drain regions having dual doped structures. Over the whole surface of the substrate 10 on which the transistors are formed, a first interlayer insulating layer 15 is deposited and planarized. The first interlayer insulating layer 15 in the active region is etched to form self-aligned contact pad holes, and a conductive layer of material such as polysilicon is deposited over the substrate to fill the self-aligned contact holes. Then, the conductive layer and the first interlayer insulating layer 15 are etched by means of a chemical-mechanical planarization (CMP) process to form bit line contact pads (not shown) and storage contact pads 13 in the self-aligned contact holes.

Thereafter, a second interlayer insulating layer 17 is formed over the substrate on which the contact pads are formed. The second interlayer insulating layer 17 is patterned to form bit line contact holes 18 (not shown in the cell area of FIG. 1). At this time, in the peripheral/core area, the bit line contact holes 18 are formed at places where a bit line pattern is to be connected to the substrate, as shown in FIG. 2. Then, a barrier metal layer 19' is thinly formed over the whole surface of the substrate on which the bit line contact holes are formed. Next, a conductive layer 20 of material such as tungsten is formed on the barrier metal layer 19' to form bit line contacts or contact plugs. Thereafter, a barrier metal layer 19, a conductive layer 21 of material such as polysilicon, and a silicon nitride protecting layer 23 are continuously formed and patterned to form the bit line pattern, as shown in FIG. 2. Alternatively, after the bit line contact holes 18 are formed, the conductive layer 21 and the silicon nitride protecting layer 23 can be continuously formed without forming of the barrier metal layer 19' and the conductive layer 20, and patterned to form the bit line pattern and the bit line contacts. On side walls of the bit line pattern, bit line spacers 25 which are composed of a silicon nitride layer are formed. The protecting layer 23 and the bit line spacers 25 function to prevent bridges between storage contact plugs and bit lines from being occurred when the storage contact plugs are formed. Thus, the bit lines having the spacers are formed. At this time, the portions of the bit line pattern having enlarged widths as described above forms bit lines having enlarged width portions at a portion of the peripheral/core area, to connect the bit lines with upper layered circuit wiring through metal contact plugs which are to be formed later.

Once the bit lines having the spacers are formed, a third interlayer insulating layer 27 is formed over the whole surface of the substrate and a planarization process is carried out to the third interlayer insulating layer 27. On the third interlayer insulating layer 27, a silicon nitride layer which acts generally as an etch stop layer 29 is formed. Then, the third interlayer insulating layer 27 and the etch stop layer 29 are patterned to form storage contact holes exposing the storage contact pads 13. And then, a conductive polysilicon layer is deposited and planarized to form storage contact plugs 31 filling the storage contact holes. Thereafter, cylindrical shaped storage electrodes 33 which are connected with the contact plugs 31 are formed and a dielectric layer 35 is thinly deposited. On the dielectric layer 35, a conductive polysilicon layer is formed and patterned to form plate electrodes 37. After a fourth interlayer insulating layer 39 is formed over the whole surface of the substrate over which the plate electrodes 37 are formed, metal contact holes are formed. A conductive layer of metal material such as CVD tungsten is deposited over the whole surface of the substrate over which the metal contact holes are formed, and planarized to form metal contact plugs 41.

At this time, when the metal contact holes are formed, there is a need to expose a portion of the plate electrodes 37 or the bit lines. Also, at a portion of the peripheral/core area, the surface of the substrate has to be exposed. Namely, the depth of the metal contact plugs 41 is different according to the positions thereof, and according to the particular needs, a portion of the metal contact plugs 41 has to be passed through the protecting layer 23 and connected to the bit lines. However, if the depth of the metal contact plugs 41 is increased whenever the height of the storage electrodes 33 is increased, there is a problem that the width of the metal contact holes is proportionally increased. An increase in the depth and the width of the metal contacts or contact plugs results in a problem that the metal contact holes are not formed deep enough to expose the surface of the substrate, or that the metal contact plugs are misaligned to penetrate a layer of adjacent elements, for example a capping layer of gate electrodes of transistors, thereby causing a short circuit with the gate electrodes, as shown in FIG. 2.

Also, if the bit lines are formed of polysilicon, and a misalignment between the bit lines and the metal contact holes has occurred, then the contact holes will be formed to expose side walls of the bit lines and circumference thereof. Under this state, if a barrier metal layer forming the metal contact plug is formed in the contact holes, bad step coverage can be formed between the side walls of the bit lines and the circumference thereof, and cracks can be generated in the barrier metal layer. Also, contact resistance between the bit lines and the metal contact plugs can be increased because of the bad step coverage and the cracks, thereby deteriorating the performance of the device.

SUMMARY OF THE INVENTION

It is a feature of an embodiment of the present invention to provide an improved dynamic random access memory (DRAM) device and method of manufacturing the same, which can prevent fabrication problems related to an increase in the depth of metal contacts.

It is another feature of an embodiment of the present invention to provide an improved dynamic random access memory (DRAM) device and method of manufacturing the same, which can prevent increase of contact resistance between the bit lines and the metal contacts and short circuit between the metal contacts and adjacent or surrounding elements due to misalignment of the metal contacts.

It is still another feature of an embodiment of the present invention to provide an improved dynamic random access memory (DRAM) device and method of manufacturing the same, which can realize a high integration density.

These and other features are provided, according to the present invention, by a method of manufacturing a DRAM device and the DRAM device manufactured thereby. The method of manufacturing DRAM device comprises forming MOS transistors on a substrate; forming an interlayer insulating layer on the whole surface of the substrate on which the MOS transistors are formed; forming at least bit line contact holes in the interlayer insulating layer deposited on the whole surface of the substrate on which the MOS transistors are formed; forming a conductive layer for forming bit lines, a subsidiary silicon oxide layer, and a subsidiary silicon nitride layer over the whole surface on which the bit line contacts are formed; forming a bit line pattern having enlarged width portions at a portion of a peripheral/core area by patterning the conductive layer, the subsidiary silicon oxide layer, and the subsidiary silicon nitride layer; forming a bit line interlayer insulating layer of silicon oxide material over the whole surface of the substrate over which the bit line pattern is formed; planarizing the bit line interlayer insulating layer to expose the upper surface of the subsidiary silicon nitride layer of the bit line pattern; forming enlarged grooves exposing portions of the conductive layer of the bit line pattern forming bit lines by wet-etching the subsidiary silicon nitride layer of the bit line pattern to form grooves and then etching isotropically the subsidiary silicon oxide layer and the bit line interlayer insulating layer around the grooves; forming a silicon nitride layer over the whole surface of the substrate over which the enlarged grooves are formed; forming a silicon nitride pattern by etching anisotropically the whole surface of the silicon nitride layer to expose the bit line interlayer insulating layer, the silicon nitride pattern having silicon nitride spacers formed on side walls of the enlarged grooves positioned on the conductive layer forming the bit lines at the enlarged width portions of the bit line pattern; forming storage node contacts, storage nodes, dielectric layer and plate electrodes at a cell area; forming a wiring interlayer insulating layer on the whole surface of the substrate over which the plate electrodes are formed; forming metal contact holes exposing the upper surface of the conductive layer of the enlarged width portions of the bit line pattern, a portion of each upper surface of plate electrodes and a portion of the upper surface of the substrate; and forming plugs filling the metal contact holes by depositing a conductive layer over the whole surface of the substrate over which the metal contact holes are formed.

In the method of the present invention, forming at least bit line contact holes can include forming separately self-aligned pads for storage node contacts and bit line contacts in said cell area. Forming self-aligned pads comprises forming a first interlayer insulating layer on the whole surface of the substrate on which the MOS transistors are formed, patterning the first interlayer insulating layer to expose a portion of an active region in the cell area, forming a polysilicon layer on the whole surface of said substrate on which the portion of the active region is exposed, and planarizing the polysilicon layer and the first interlayer insulating layer up to the upper surface of the transistors to divide the pads.

Also, forming at least bit line contacts can include forming metal contact pad holes exposing a portion of the substrate in the peripheral/core area as well as the bit line contact holes exposing a portion of the bit line contact pads in the cell area by depositing a second interlayer insulating layer and an etch stop layer of silicon nitride material over the whole surface of the substrate and patterning them, after forming the pads. Metal contact pads that function to reduce depth of metal contacts are formed in the metal contact pad holes along with bit line contacts or contact plugs. At this time, alternatively, the bit line contact plugs can be formed along with the bit line pattern in the step of forming the bit line pattern. The etch stop layer can prevent a portion of the interlayer insulating layer adjacent to the metal contact pad holes from being etched and thereby formation of a bridge or short circuit between the metal contact plug to be formed later and surrounding gate lines can be prevented even though the metal contact holes for the metal contact plugs are formed to have a relatively large width or misaligned slightly. After forming of the bit line contact plugs, the etch stop layer is patterned to leave only a portion thereof around the metal contact pads.

According to the DRAM device in accordance with the present invention, the DRAM device comprises a portion of bit lines having enlarged width portions at a portion of a peripheral/core area to connect the bit lines with upper layered circuit wiring through metal contacts; and spacers formed of a layer of material having an etch selectivity with respect to a bit line interlayer insulating layer deposited after the bit lines are formed, and disposed on sides of an upper surface of each enlarged width portion to protect sides of the enlarged width portions. Preferably, an interlayer insulating layer and an etch stop layer of material having an etch selectivity with respect to the bit line interlayer insulating layer are disposed between the bit lines and transistors of a substrate, and metal contact pads formed along with bit line contact plugs are formed to pass through the interlayer insulating layer and the etch stop layer.

These and other features of the present invention will be readily apparent to those of ordinary skill in the art upon review of the detailed description that follows.

DETAILED DESCRIPTION OF THE PREFERRED EMBODIMENTS

Korean Patent Application No. 2001-5979, filed on Feb. 7, 2001, and entitled: "DRAM Device and Method of Manufacturing the Same," is incorporated by reference herein in its entirety.

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully covey the scope of the invention to those of ordinary skill in the art. In drawings, like reference characters refer to like elements throughout.

FIG. 3 to FIG. 9 illustrate flow diagrams showing the process steps of a method of manufacturing dynamic random access memory (DRAM) device in accordance with the present invention. In each figure, portions of both cell and peripheral/core areas of the DRAM device are concurrently illustrated to be contrasted with each other.

Figure 3:
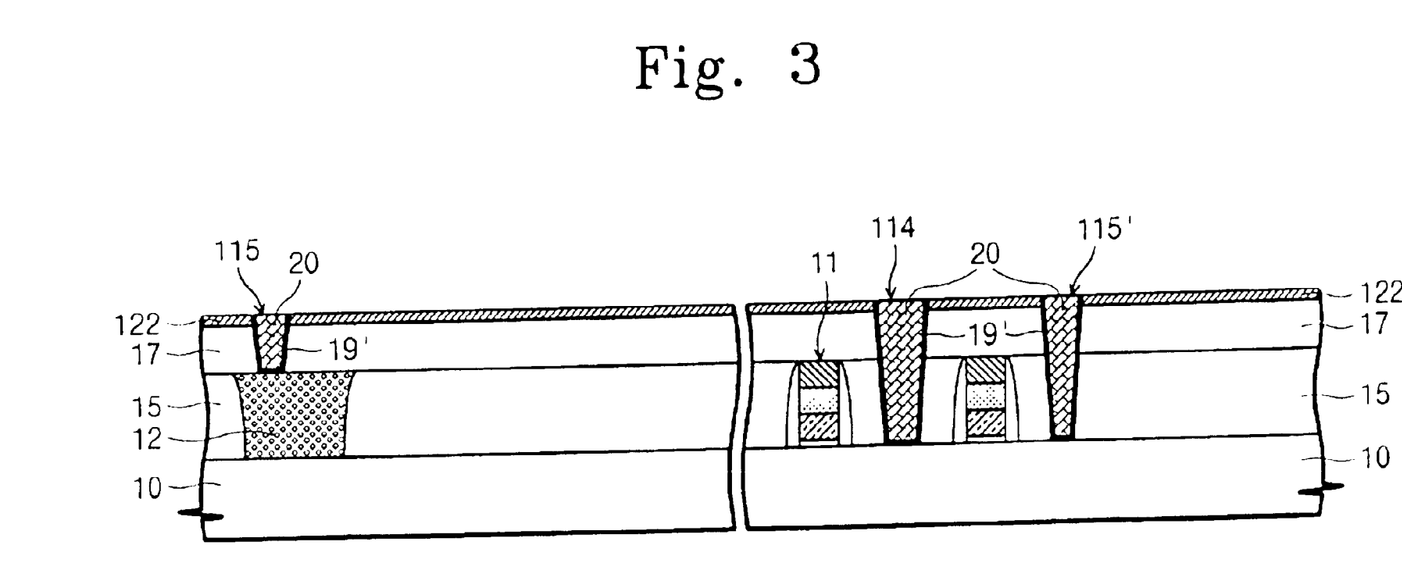
FIG. 3 to FIG. 9 illustrate flow diagrams showing the process steps of a method of manufacturing dynamic random access memory (DRAM) device in accordance with the present invention.

Referring now to FIG. 3, a gate insulating layer is formed by means of thermal oxidation on a substrate 10 on which various wells and an isolation layer are formed. Then, a polysilicon layer, a metal silicide layer and a gate capping layer which form gate electrodes later are continuously formed on the gate insulating layer. And then, the polysilicon layer, the metal silicide layer, and the gate capping layer are continuously patterned to form gate pattern 11 by using a photo-resist pattern as an etch mask. Thereafter, a low concentration ion implantation is carried out to the substrate 10. After spacers are formed on side walls of the gate pattern 11, a high concentration ion implantation is carried out to the substrate 10. As a result, transistors are formed to have channels and source/drain regions having dual doped structures.

Over the whole surface of the substrate on which the transistors are formed, a silicon oxide layer is deposited and planarized to form a first interlayer insulating layer 15. To form contact pads, the first interlayer insulating layer 15 is etched to form contact holes exposing an active region of the substrate under gaps of the gate pattern at a cell area and then a conductive layer of material such as polysilicon is formed over the substrate to fill the contact holes. Then, the conductive layer and the first interlayer insulating layer 15 are etched to form bit line contact pads 12 and storage node contact pads 13 by means of a chemical-mechanical planarization (CMP) process. Thereafter, a second interlayer insulating layer 17 composed of a silicon oxide layer is formed over the substrate on which the contact pads are formed. On the second interlayer insulating layer 17, an etch stop layer 122 is deposited. The etch stop layer 122 is generally formed of a silicon nitride layer having a thickness of several tens to several hundred Å.

The etch stop layer 122 and the second interlayer insulating layer 17 are patterned to form bit line contact holes which expose the bit line contact pads 12. At this time, contact holes which expose the surface of the substrate are also formed at bit line contact regions and metal contact regions in the peripheral/core area on which bit line contact plugs 115' and metal contact pads 114 are to be formed later. Then, a barrier metal layer 19' composed of a double layered structure of titanium/titanium nitride is thinly formed and then a tungsten layer 20 of material such as tungsten are formed on the barrier metal layer 19' by a tungsten chemical vapor deposition (CVD) process to fill the bit line contact holes. And then, a tungsten CMP process is carried out. As a result, bit line contact plugs 115, 115' and metal contact pads 114 which are composed of the barrier metal layer 19' and the tungsten layer 20 are obtained.

In the cell area of FIG. 3, the gate pattern 11 is not shown since the cell area of FIG. 3 is a cross-section of bit line contact pad/plug portion taken parallel to a longitudinal direction of gate lines. Also, in the peripheral/core area of FIG. 3, the bit line contact pads 12 are not shown since they are not formed around the gate electrodes of the transistors.

Figure 4:
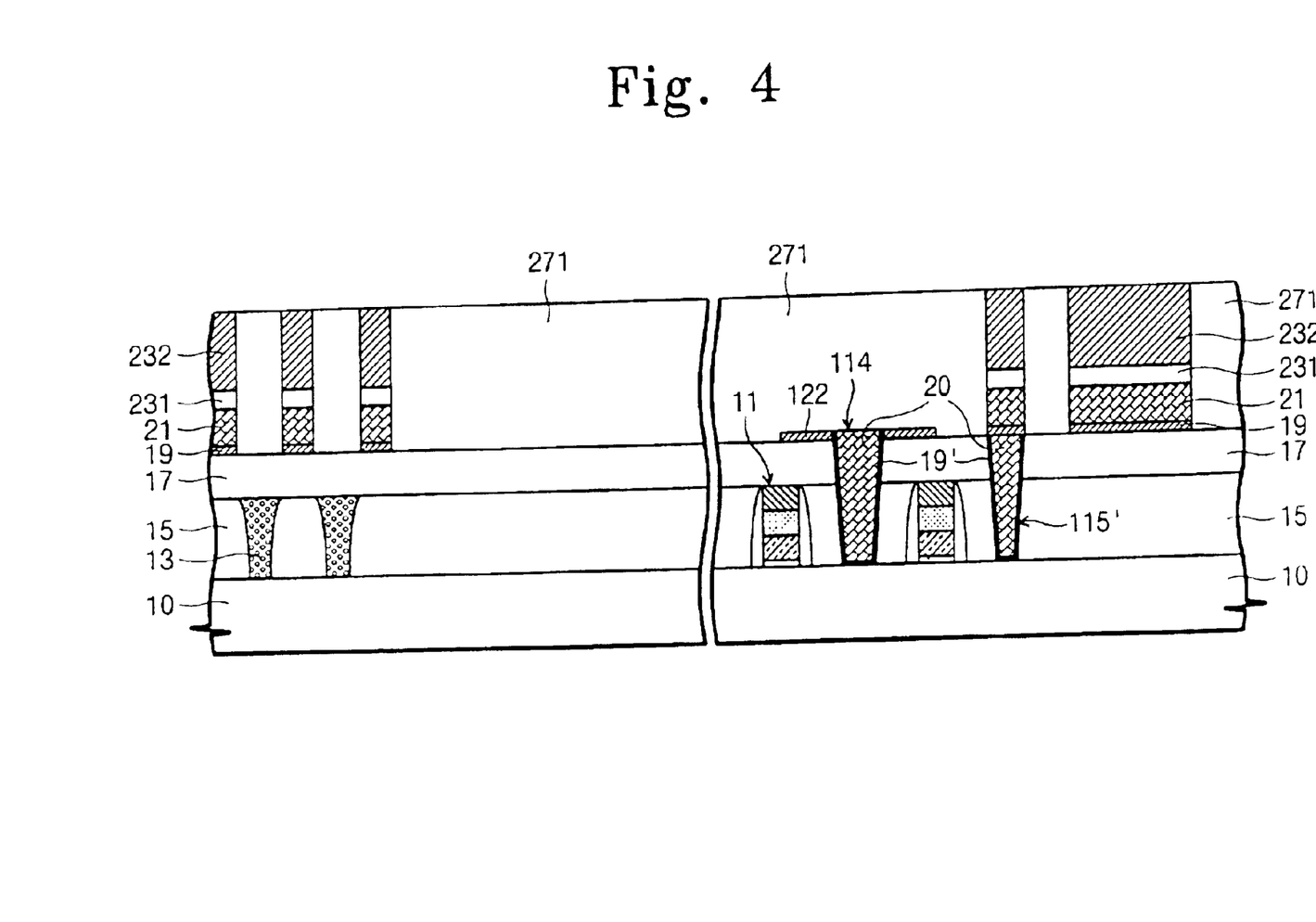

The cell area of FIG. 4 illustrates a cross-section of storage node contact pad portion taken parallel to a longitudinal direction of gate lines.

Referring to FIG. 4, a patterning process is carried out to leave only a portion of the etch stop layer 122 formed around the metal contact pad 114 at the peripheral/core area. Then, a titanium nitride layer 19 is thinly formed as a barrier layer over the whole surface of the substrate 10 and then a bit line conducting layer 21 composed of polysilicon or metal such as tungsten is formed. To form bit lines on the second interlayer insulating layer 17, the titanium nitride layer 19 and the bit line conducting layer 21 are formed to a thickness of 400 Å and 1000 Å, respectively. On the bit line conducting layer 21, a subsidiary oxide layer 231 is formed of a plasma-enhanced-tetra ethylene-ortho-silicate (PE-TEOS) process or a high density plasma (HDP) silicon layer to a thickness of about 500 Å. As a sacrificial layer 232 which forms a subsidiary layer along with the subsidiary oxide layer 231, a silicon nitride layer is deposited to a thickness of 2000 Å. At this stage, the subsidiary layer composed of the sacrificial layer 232 and the subsidiary oxide layer 231, the bit line conducting layer 21, and the titanium nitride layer 19 are continuously patterned to form a bit line pattern by using a photo-resist pattern as a mask. Thereafter, a third interlayer insulating layer, which may also be called a bit line interlayer insulating layer, 271 is deposited on the bit line pattern and then a CMP process is carried out to expose an upper surface of the sacrificial layer 232 of the bit line pattern. The bit line interlayer insulating layer is made of silicon oxide.

At this time, in the peripheral/core area, the bit line pattern is formed to have portions having narrow or normal widths connected to the bit line contact plugs 115' and portions having wide or enlarged widths which are to be connected with metal contact plugs 143 later.

Figure 5:
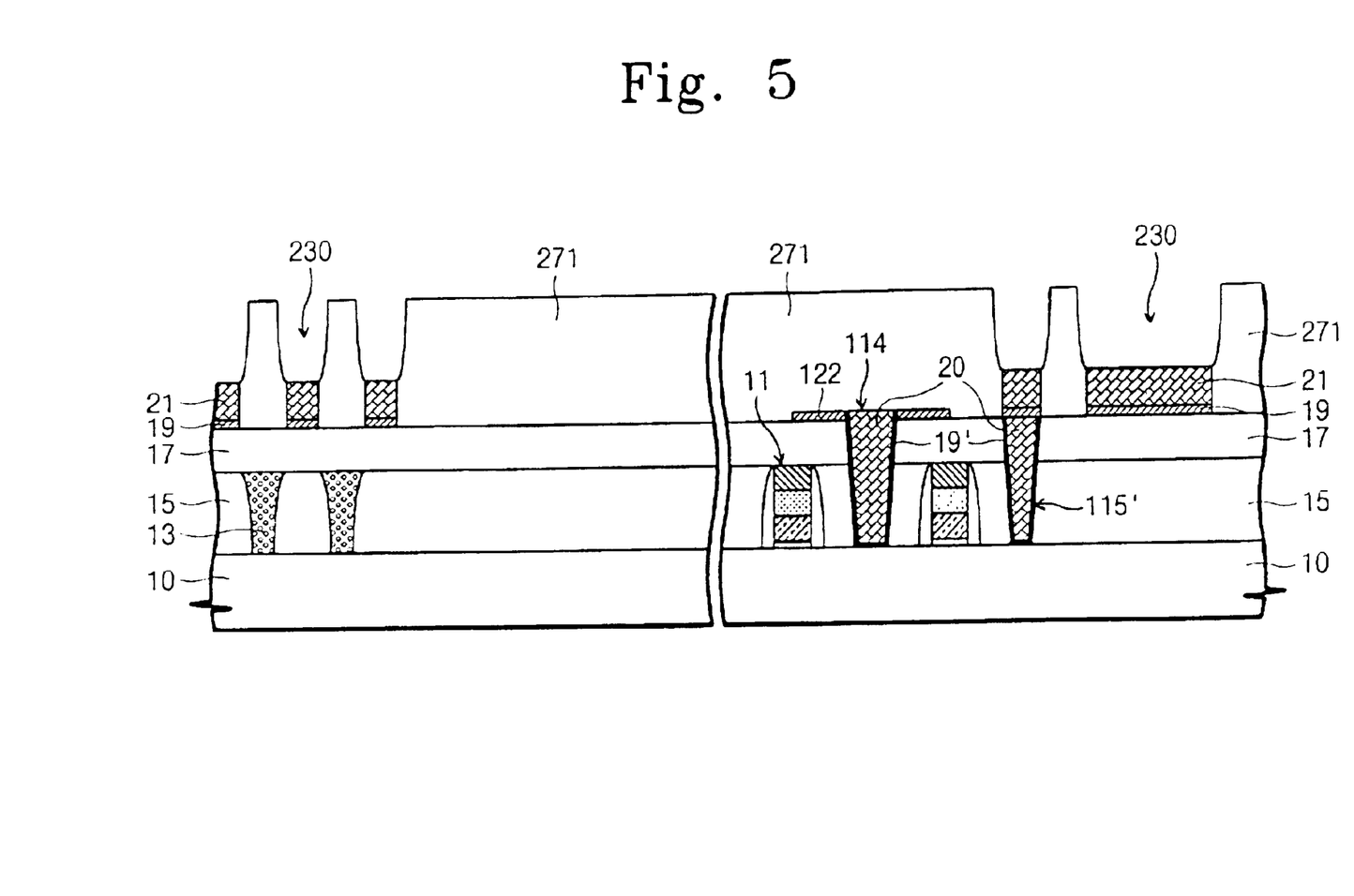

Referring to FIG. 5, first, exposed sacrificial layer 232 of the bit line pattern is etched to be removed. The sacrificial layer 232 is removed by means of a phosphoric acid striping process. At this time, only the sacrificial layer 232 is selectively removed since it has an etch selectivity of more than 50:1 with respect to the oxide layer. The subsidiary oxide layer 231, which forms a subsidiary layer along with the sacrificial layer 232, functions to prevent the conductive layer 21 of the bit line pattern from being etched by the phosphoric acid. As a result, first grooves are formed in portions of the third interlayer insulating layer 271 in which the sacrificial layer 232 is removed. Then, the subsidiary oxide layer 231 is isotropically etched to form second grooves 230 exposing the conductive layer 21 of the bit line pattern, i.e., the bit lines, as shown in FIG. 5. The second grooves 230 have widths wider than the first grooves have round shaped side walls in which corners are removed by means of the isotropic etching process. The isotropic etching process usually use a wet etching method. Also, on the portions of the bit line pattern having enlarged widths, i.e. wide or enlarged width portions of bit lines at the peripheral/core area, grooves having widths corresponding to the enlarged width portions of the bit lines are formed.

Figure 6:
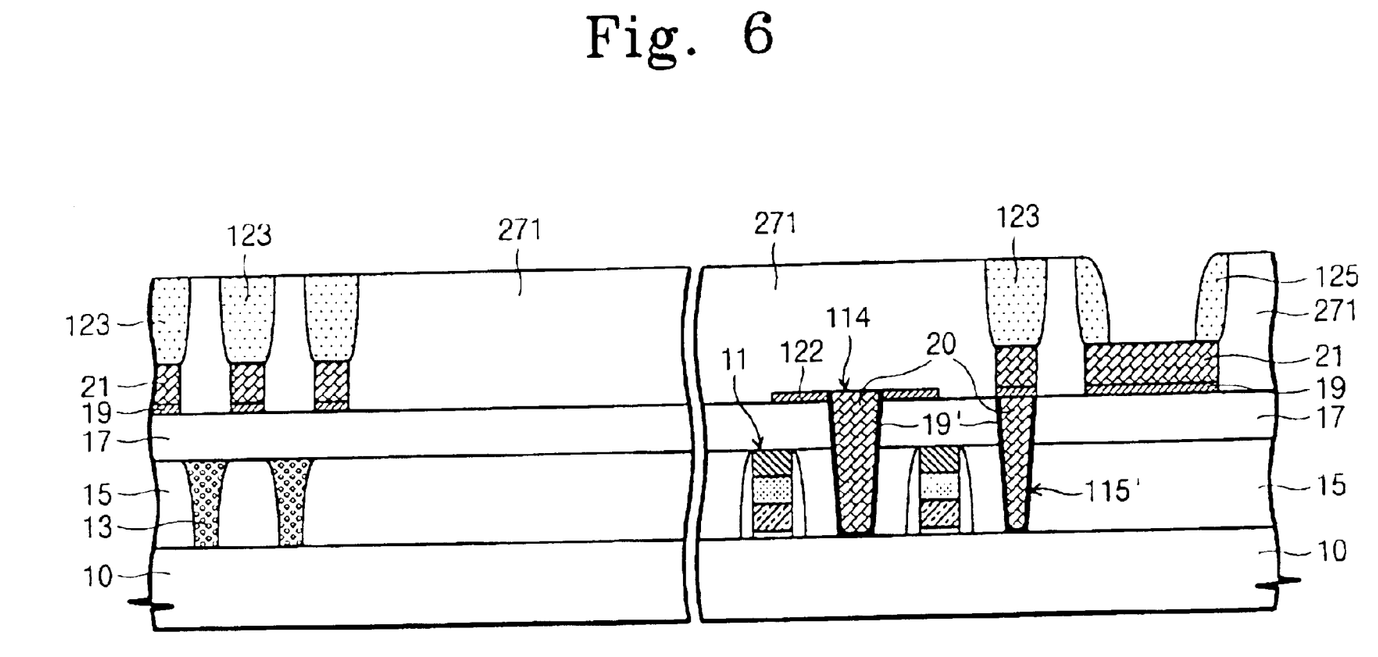

Referring to FIG. 6, a silicon nitride layer is deposited enough to fill the grooves 230 over the whole surface of the substrate over which the grooves 230 are formed on the bit lines. Then, an anisotropic etching process, i.e., an etch back process is carried out on the whole surface of the substrate to expose the third interlayer insulating layer bit line interlayer insulating layer 271. As a result, a silicon nitride pattern 123 filling the grooves 230 is formed. However, in the grooves 230 positioned on the enlarged width portions of the bit lines at the peripheral/core area, silicon nitride spacers 125 are formed. The spacers 125 are formed of a material that has an etch selectivity with respect to the bit line interlayer insulating layer 271.

In a conventional method, the bit lines are protected by means of a silicon nitride capping or protecting layer disposed thereon and spacers disposed on the side walls thereof. However, in the present invention, the second grooves 230 having width wider than the bit lines are formed on the bit lines and filled with the silicon nitride pattern 123. This is done to reduce capacitance of parasite capacitors between the bit lines and storage node contact plugs which are formed later. Namely, if the capacitance of the parasite capacitors formed between the bit lines and the storage node contact plugs is high, a signal passing through certain bit lines is weakened enough to be improperly sensed under the influence of the adjacent bit lines, and thereby electric charge accumulated in cell capacitors through proper channels according to the signal strength is reduced, thereby reducing effective capacitance of cell capacitors. Practically, when required capacitance of the cell capacitors is 25 to $30 \times 10^{-15}$ F (25–30 fF), it was reduced by 30% according to theoretical calculations based on the physical dimensions of the device and about 5 fF according to experimental value.

As the semiconductor device is highly integrated, it is important to increase capacitance of the cell capacitor in the DRAM device. However, covering the bit lines with the silicon nitride layer to prevent short circuit between the bit lines and the storage node contacts from occurring causes a new problem since distance between the adjacent bit lines is very small in the high integration device. Accordingly, it is preferable that a silicon oxide layer having a low dielectric constant is disposed between the bit lines and the storage node contact plugs.

Figure 7:
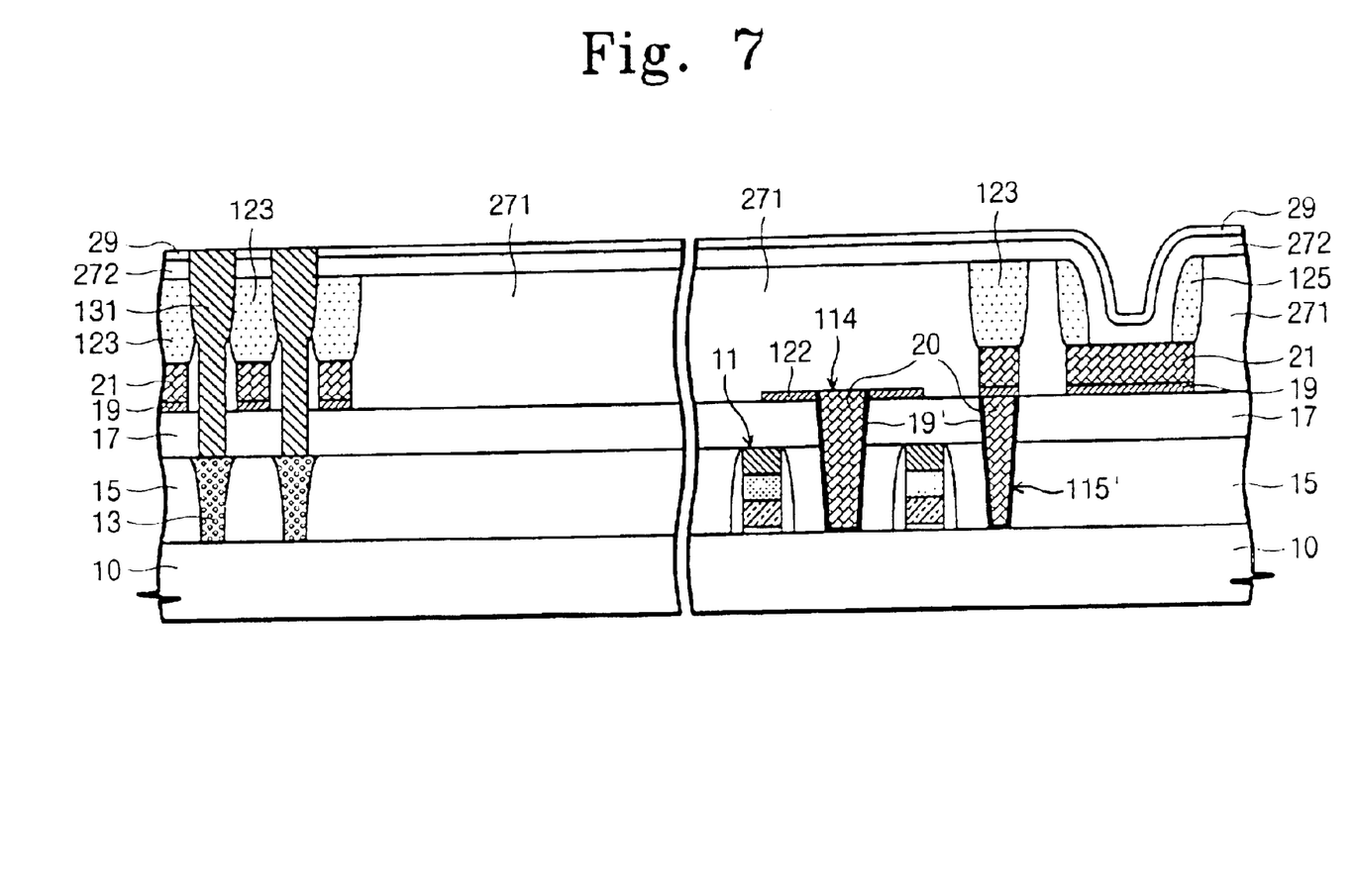

Referring to FIG. 7, an additional silicon oxide layer 272 is deposited over the whole surface of the substrate. The additional silicon oxide layer 272 is formed to prevent the silicon nitride pattern 123 from being over-etched since in a sequent patterning process, it is apt to be over-etched in case a photo-resist contact pattern is formed directly on the silicon nitride pattern 123 filling the grooves 230. Then, an etch stop layer 29 is formed of a silicon nitride layer. By using the photo-resist pattern as a mask, the etch stop layer 29, the additional silicon oxide layer 272, the third interlayer insulating layer (bit line interlayer insulator layer) 271 and the second interlayer insulating layer 17 are continuously patterned to form storage node contact holes. At this time, holes in the photo-resist pattern can be formed to have width wider than the required width of storage node contact plugs 131 since the silicon nitride layer pattern 123 has etch selectivity with respect to the oxide layers 272, 271 and 17. Thereafter, a polysilicon layer is deposited and then planarized to form the storage node contact plugs 131.

Figure 8:
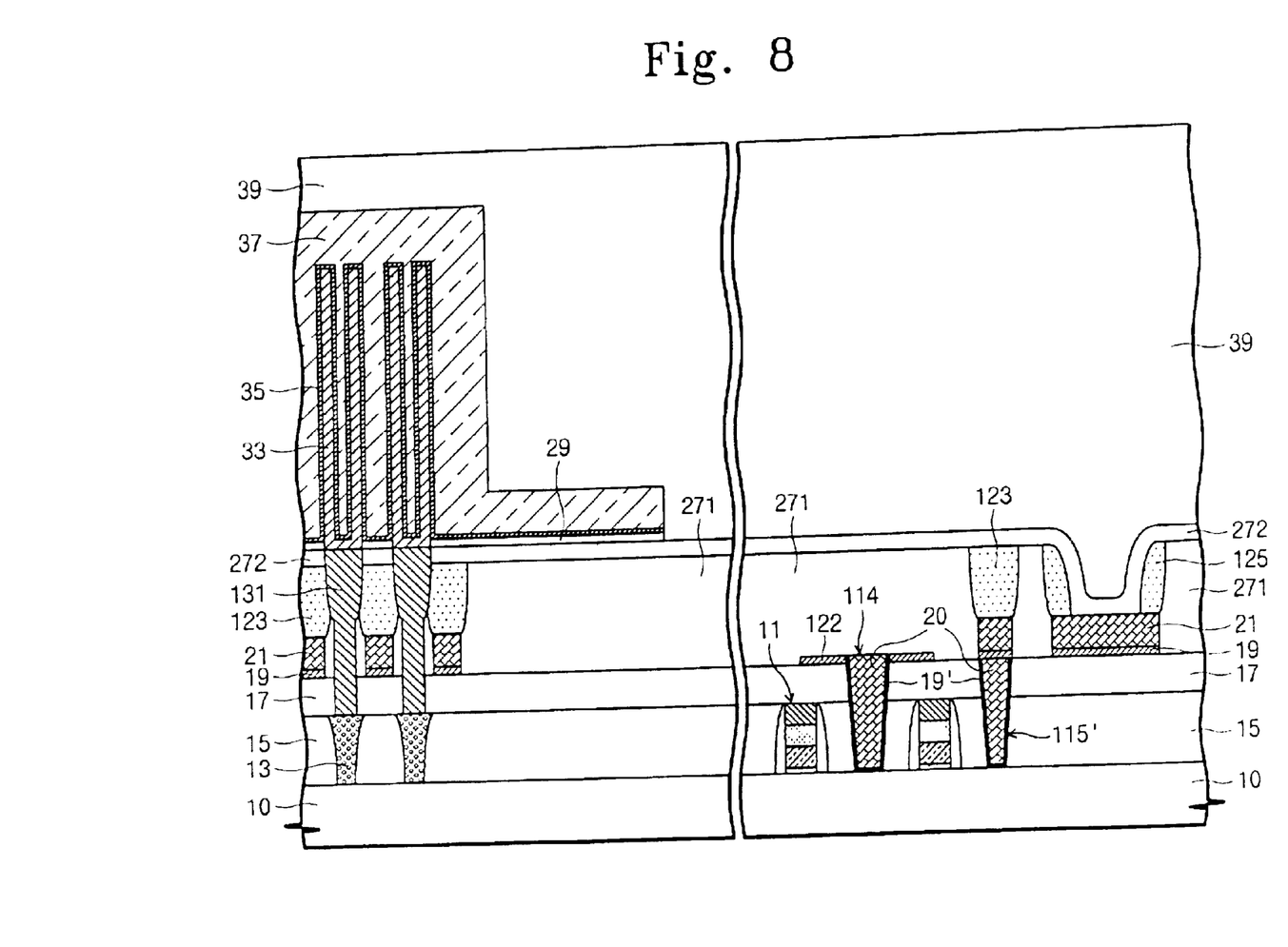

Referring to FIG. 8, to form cylindrical shaped storage nodes 33 which are connected to the storage node contact plugs 131, a molding oxide layer is deposited and patterned to form storage node holes exposing the storage node contact plugs 131. Then, a polysilicon layer is conformally deposited and an oxide or photo-resist sacrificial layer is formed to fill completely the storage node holes. And then, a planarization process is carried out to divide the storage nodes 33. Thereafter, the sacrificial layer filling the storage node holes and the molding oxide layer between the storage nodes 33 are removed. As a result, the cylindrical shaped storage nodes 33 are obtained. Then, a dielectric layer 35 is thinly deposited. And then, a polysilicon layer is formed and patterned to form plate electrodes 37. After patterning of the polysilicon layer, the dielectric layer 35 and the etch stop layer 29 are removed in the peripheral/core area. However, the dielectric layer 35 and the etch stop layer 29 in the cell area remain. The polysilicon layer remained in the cell area forms plate electrodes 37. Thereafter, a fourth interlayer insulating layer (which may also be called a wiring interlayer insulating layer) 39 is formed and planarized.

Figure 9:
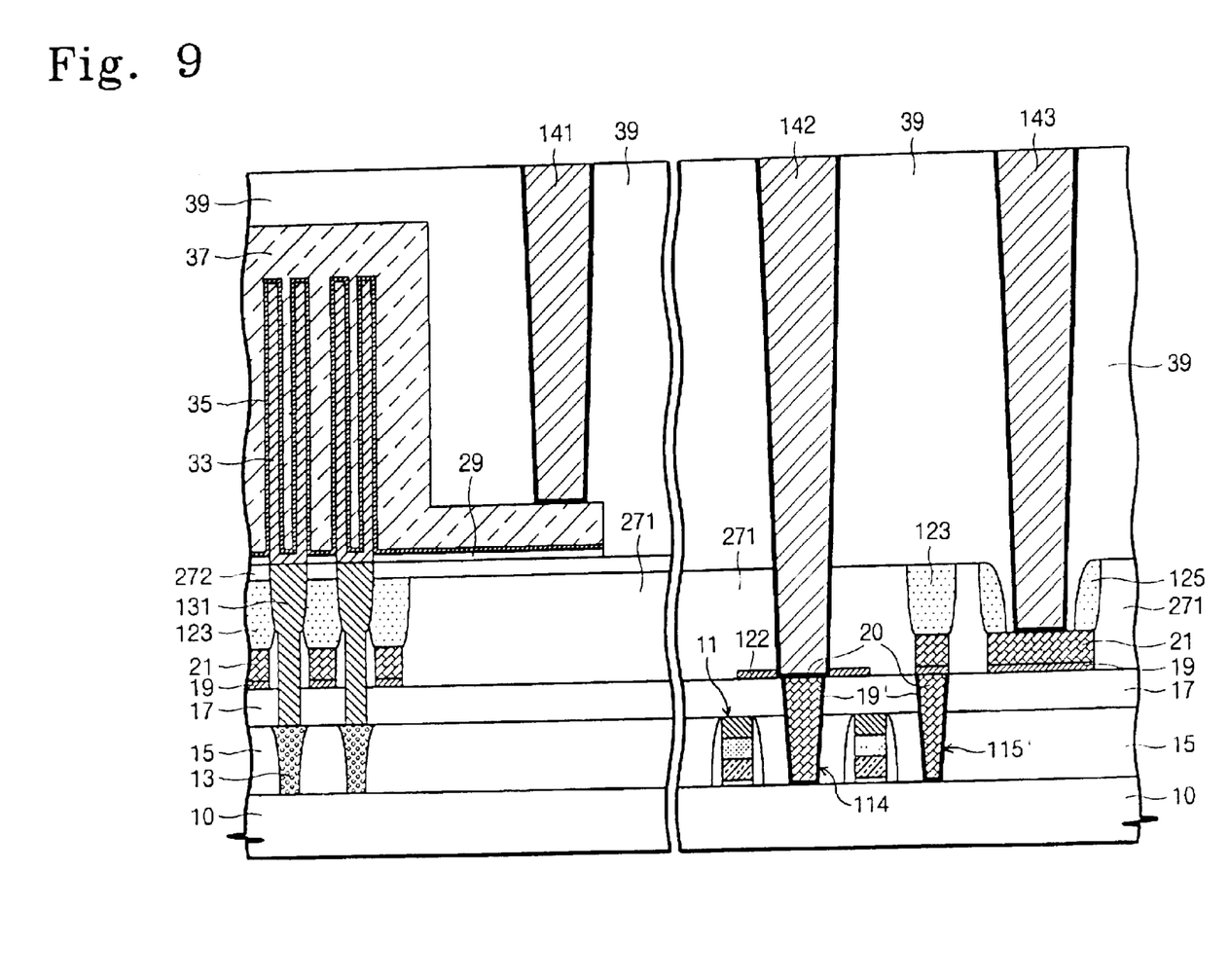

Referring to FIG. 9, metal contact plugs 141, 142, 143 which connect upper circuit wiring with lower semiconductor elements are formed by a photo-exposure and etching process of using a photo-resist pattern as a mask. In the photo-exposure and etching process, the fourth interlayer insulating layer 39 and the third interlayer insulating layer 271 are etched to expose the metal contact pads 114, the enlarged width portions of the bit lines 21 having wide widths and portions of circumference regions of the plate electrodes 37. At this time, etching having an etch condition only with respect to the silicon oxide layer can be carried out. Then, a barrier metal layer is deposited and a conductive layer that forms the metal contact plugs is formed. The conductive layer is composed of metal material such as CVD tungsten. And then, a planarization process is carried out to expose the fourth interlayer insulating layer 39 and divide the metal contact plugs 141, 142 and 143.

Figure 10:
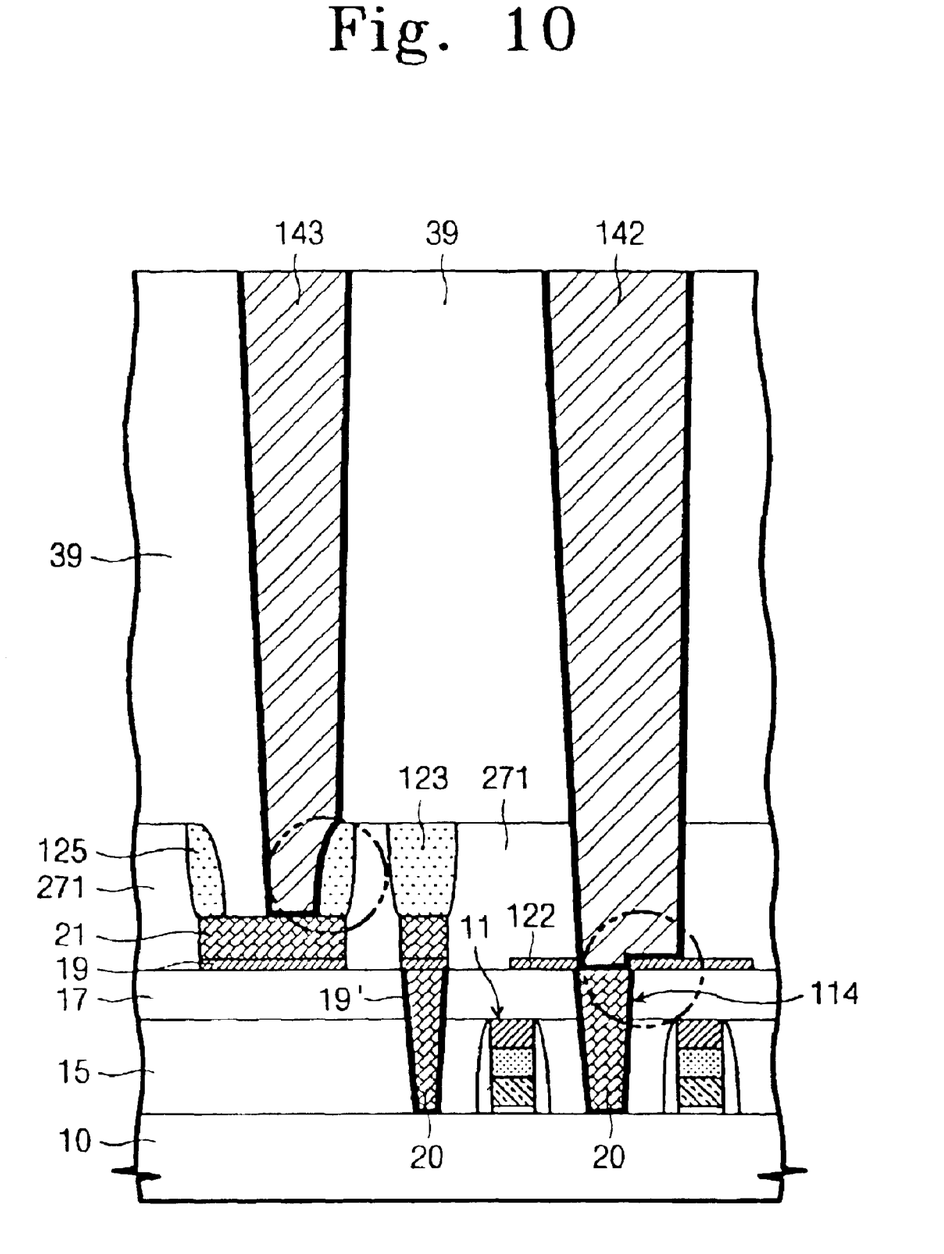
FIG. 10 illustrates a cross-sectional view of an example that process defects were prevented in accordance with the method of the present invention when misalignment of metal contact holes had occurred in a peripheral/core area.

FIG. 10 illustrates an example in which process defects were prevented in accordance with a method of the present invention when a misalignment of metal contact holes had occurred in a peripheral/core area. Namely, in the case of a metal contact plug 142, a metal contact pad 114 is formed in width sufficient enough to have alignment margin and an etch stop plug 122 composed of a silicon nitride layer is positioned around the upper surface of the metal contact pad 114. Accordingly, even though a metal contact hole for the metal contact plug 142 is formed to have a relatively large width and misaligned slightly as shown in FIG. 10, the etch stop layer 122 can prevent the second interlayer insulating layer 17 from being etched. Thus, short circuit between the metal contact plug 142 and the adjacent gate line or pattern 11 disposed under the metal contact plug 142 is prevented. Also, in case of a metal contact pad 143, even though a contact hole for the metal contact pad 143 is formed to be slightly misaligned on the upper surface of a bit line conducting layer 21 having wide width, i.e., enlarged width portion of a bit line, a portion of the third interlayer insulating layer 271 adjacent to a side of the enlarged width portion of the bit line is not etched owing to a spacer 125. Accordingly, in forming of a barrier metal layer of the metal contact plug 143, problems such as bad step coverage of the barrier metal layer formed by etching of the portion of the third interlayer insulating layer 271 adjacent to the side of the enlarged width portion of the bit line and increase of contact resistance due to the bad step coverage can be prevented. Also, a problem that the metal contact hole is further etched down and connected to the substrate or surrounding elements, thereby causing a short circuit or a bridge therebetween, can be prevented.

As apparent from the foregoing description, it can be appreciated that the present invention provides a dynamic random access memory (DRAM) device and method of forming the same, which can: (a) prevent an increase in contact resistance between the bit lines and the metal contacts, (b) short circuits between the metal contacts and adjacent or surrounding elements due to misalignment of the metal contacts, (c) increase process margin by enhancing self-alignment function in forming of the metal contacts at a peripheral/core area. Also, the present invention can reduce capacitance of parasite capacitors by filling spaces between bit lines and storage node contact plugs with a silicon oxide layer having a low dielectric constant, In the drawings and specification, there has been disclosed a preferred embodiment of the present invention and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A DRAM device in which a portion of bit lines has enlarged width portions at a portion of a peripheral/core area to be connected with upper layered circuit wiring through metal contacts, comprising:

spacers formed of a layer of material having an etch selectivity with respect to a bit line interlayer insulating layer deposited after said bit lines are formed, and disposed on sides of an upper surface of each said enlarged width portion to protect sides of said enlarged width portions.

2. The DRAM device according to claim 1, wherein said interlayer insulating layer is formed of a silicon oxide layer, and said spacers are formed of a silicon nitride layer.

3. The DRAM device according to claim 1, wherein an interlayer insulating layer and at least a portion of an etch stop layer are disposed between said bit lines and translators of a substrate, and metal contact pads formed along with bit line contact plugs are formed to pass through said interlayer insulating layer and said etch stop layer.

4. The DRAM device according to claim 3, wherein said etch stop layer is formed only around said metal contact pads.

* * * * *